United States Patent
Mittelholzer et al.

(10) Patent No.: US 9,734,012 B2
(45) Date of Patent: Aug. 15, 2017

(54) DATA ENCODING IN SOLID-STATE STORAGE DEVICES

(71) Applicant: International Business Machines Corporation, Armonk, NY (US)

(72) Inventors: Thomas Mittelholzer, Zurich (CH); Nikolaos Papandreou, Thalwil (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 14/730,321

(22) Filed: Jun. 4, 2015

(65) Prior Publication Data

US 2015/0380087 A1 Dec. 31, 2015

(30) Foreign Application Priority Data

Jun. 27, 2014 (GB) .................................. 1411513.3

(51) Int. Cl.
*G06F 11/10* (2006.01)
*G11C 11/56* (2006.01)
(Continued)

(52) U.S. Cl.
CPC .......... *G06F 11/1072* (2013.01); *G11C 11/56* (2013.01); *H03M 13/11* (2013.01);
(Continued)

(58) Field of Classification Search
CPC .. H03M 13/116; H03M 13/255; H03M 13/11; H03M 13/271; H03M 13/275; H03M 13/2767; G11C 11/56
(Continued)

(56) References Cited

U.S. PATENT DOCUMENTS 7,787,307 B2    8/2010   Sarin
8,578,246 B2   11/2013   Mittelholzer et al.
(Continued)

FOREIGN PATENT DOCUMENTS

GB          2527604 A     12/2015
WO   2013093669 A1     6/2013

OTHER PUBLICATIONS

Immink, "Coding Schemes for Multi-Level Channels with Unknown Gain and/or Offset", Turing Machines Inc., Willemskade 15b-d, pp. 1-5.

(Continued)

*Primary Examiner* — James C Kerveros
(74) *Attorney, Agent, or Firm* — Robert C. Bunker

(57) ABSTRACT

Methods and apparatus 3 are provided for encoding data for storage in multilevel memory cells 2 having q cell-levels. Input data words are encoded into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$ and more preferably $\geq 3$. A first type of encoding scheme uses recursive symbol-flipping to enforce the $\mu$-constraint, adding indicator symbols to indicate the flipped symbols. A second type of encoding scheme maps data words to codewords of a union of permutation codes, the initial vectors for these permutation codes being selected to enforce the $\mu$-constraint. The N $q^{ary}$ symbols of each codeword are supplied for storage in respective cells of the multilevel memory 2.

24 Claims, 7 Drawing Sheets

(51) Int. Cl.
  G11C 13/00 (2006.01)
  G11C 29/04 (2006.01)
  H03M 13/11 (2006.01)
  H03M 13/25 (2006.01)
  H03M 13/27 (2006.01)

(52) U.S. Cl.
  CPC ....... *H03M 13/271* (2013.01); *H03M 13/275* (2013.01); *H03M 13/2767* (2013.01); *G11C 13/00* (2013.01); *G11C 2029/0411* (2013.01); *H03M 13/116* (2013.01); *H03M 13/255* (2013.01)

(58) Field of Classification Search
  USPC .......................................................... 714/766
  See application file for complete search history.

(56) References Cited

U.S. PATENT DOCUMENTS

| | | | |
|---|---|---|---|
| 2008/0320362 A1* | 12/2008 | Taubin | H03M 13/11 714/755 |
| 2009/0115648 A1 | 5/2009 | Mittelholzer | |
| 2009/0132758 A1* | 5/2009 | Jiang | G06F 11/1072 711/103 |
| 2010/0057977 A1 | 3/2010 | Graef | |
| 2011/0296274 A1 | 12/2011 | Mittelholzer et al. | |
| 2012/0246547 A1 | 9/2012 | Yekhanin et al. | |
| 2012/0254693 A1 | 10/2012 | Mittelholzer et al. | |
| 2013/0086457 A1 | 4/2013 | Mittelholzer et al. | |
| 2013/0268723 A1 | 10/2013 | Jiang et al. | |
| 2013/0290813 A1 | 10/2013 | Ramamoorthy et al. | |
| 2014/0015697 A1 | 1/2014 | Wu | |
| 2014/0126674 A1* | 5/2014 | Petrov | H03M 13/1165 375/340 |
| 2015/0364189 A1 | 12/2015 | Mittelholzer et al. | |
| 2015/0381205 A1* | 12/2015 | Zhang | H03M 13/116 714/773 |
| 2016/0070506 A1 | 3/2016 | Blaettler et al. | |

OTHER PUBLICATIONS

CH920140022GB1 Search Report, Application No. GB1411513.3, dated Dec. 17, 2014, pp. 1-5.
CH920140022GB1 Application and Drawings, application GB1411513.3, filed Jun. 27, 2014, pp. 1-32.
Alon et al., "Balancing Sets of Vectors," IEEE Transactions on Information Theory, Jan. 1988, p. 128-130, vol. 34, Issue 1.
Berger et al., "Permutation Codes for Sources," IEEE Transactions on Information Theory, Jan. 1972, p. 160-169, vol. IT-18, Issue 1.
Cover, "Enumerative Source Encoding," IEEE Transactions on Information Theory, Jan. 1973, p. 73-77, vol. IT-19, Issue 1.
Zhou et al., "Balanced Modulation for Nonvolatile Memories," arXiv Computer Science, 2012, p. 1-15.

* cited by examiner

| Multiplicity Pattern | # codes of same type |
|---|---|
| [7 6 6 5] | 12 |
| [7 7 6 4] | 12 |
| [8 6 6 4] | 12 |
| [8 7 5 4] | 24 (need only 14) |

| Multiplicity Pattern | # codes of same type |
|---|---|
| [9 8 8 7] | 12 |
| [9 9 8 6] | 12 |
| [10 8 8 6] | 12 |
| [10 9 7 6] | 24 |
| [11 8 7 6] | 24 (need only 15) |

Figure 5

| Multiplicity Pattern | # codes of same type |
|---|---|
| [5 5 5 5] | 1 |
| [6 6 4 4] | 6 |
| [6 5 5 4] | 12 |
| [7 5 4 4] | 12 |
| [8 4 4 4] | 4 |

Figure 6

| Multiplicity Pattern | # codes of same type |
|---|---|
| [5 4 4 3] | 12 |
| [6 4 3 3] | 12 |
| [5 5 3 3] | 6 (need only 2) |

Figure 7

| Multiplicity pattern of levels 0,1,2,3 | # codes of same type |
|---|---|
| [4 4 4 4] | 1 |
| [3 6 3 4], [4 3 6 3] | 2 |
| [5 3 3 5], [3 5 5 3] | 2 |
| [3 5 4 4], [4 4 5 3] | 2 |

Figure 8

| Multiplicity pattern of levels 0,1,2,3 | # codes of same type |
|---|---|
| [5 5 5 5] | 1 |
| [6 4 4 6], [4 6 6 4] | 2 |
| [4 7 4 5], [5 4 7 4] | 2 |
| [4 6 5 5], [5 5 6 4], [5 4 6 5] | 3 |

Figure 9

Case of 1 chip failure:
RBER = 4.1e-5, i.e.,
raw byte error rate = 3.3e-4

DATA ENCODING IN SOLID-STATE STORAGE DEVICES

BACKGROUND

This invention relates generally to data encoding in solid-state storage devices. Methods and apparatus are provided for encoding data for storage in multilevel solid-state memory, together with data storage devices incorporating same.

In solid-state memory such as flash memory and phase-change memory, the fundamental storage unit (the "cell") can be set to q different states, or "levels", permitting storage of information. Each cell can be used to store a $q^{ary}$ symbol with each of the q possible symbol values being represented by a different cell level. In so-called "multilevel" memory, the memory cells can be set to q>2 cell levels, permitting storage of more than one bit per cell.

Detection of data stored in multilevel memory cells relies on identifying the q different cell levels on readback. In flash and phase change memory (PCM), for example, the different cell levels exhibit different electrical charge and electrical resistance characteristics respectively, and these can be detected via current or voltage measurements on the cells. On readout of cells, the read signal level can be compared with a set of reference signal levels indicative of the q cell levels in order to determine which level each cell is set to and thus detect the stored symbol value. A basic problem here is that the physical quantity measured during cell readout is subject to variability, e.g. due to noise and/or drift in measured values with time or cell usage. Multiple read operations on cells set to any given cell level will therefore yield a distribution of read signal levels.

Accurate characterization of the level distributions on readback of multilevel-cell (MLC) memory is crucial to readback performance. Currently the more sophisticated read detection systems use self-adaptive techniques in which the readback signals from a block of memory cells are processed to estimate statistics for the q cell levels, and these level statistics are then used for detection of data in that block of cells. Such self-adaptive techniques are particularly useful where the level statistics are not stationary in time and cannot be determined a priori by characterization, e.g. due to drift effects mentioned above. As readback block sizes decrease, however, it becomes more difficult to obtain reliable estimates of the level statistics. Current PCM applications, for example, use a readback block size of 64 bits, which corresponds to 32 (q=4)-level cells, and further reduction in block size can be envisaged. When reading and writing such small blocks of data, it is possible that one or more of the q cell levels is only written a few times, or even not at all. Such data asymmetry can make it very difficult to estimate level statistics, resulting in poor error-rates on readback.

In view of the above, it is desirable to program all MLC levels as many times as possible. Prior solutions to this type of problem propose encoding the input data using balanced codes. In the codewords for balanced codes, all of the q symbol values appear with equal multiplicities (number of occurrences). This ensures that each cell level is written the same number of times, and thus appears the maximum number of times on readback. For example, "Coding Schemes for Multi-Level Channels with Unknown Gain and/or Offset", Immink, Proc. IEEE Intern. Symp. on Information Theory, 2013, pp. 709-713, proposes codes in which all codewords have equal balance and energy. Schemes for achieving balanced binary sequences via a bit-flipping approach are disclosed in "Balancing sets of vectors," Alon et al., IT-34, January 1988, pp. 128-1301. Here, two bit-flipping algorithms are proposed for binary length-n sequences that have either 1 bit or $\log_2(n)$ bit redundancy. "Balanced modulation for nonvolatile memories", H. Zhou, A. Jiang, http://arxiv.org/abs/1209.0744, September 2012, discloses use of a bit-flipping algorithm to achieve balanced binary sequences, permitting level estimation in non-volatile memories by adjusting level thresholds on readback to balance the readback words. A recursive bit-flipping approach is disclosed for MLC memory and requires significant redundancy, with consequent code rate penalty.

SUMMARY

An embodiment of the present invention provides a method for encoding data for storage in multilevel memory cells having q cell-levels. The method encodes data words into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$. The method supplies the N symbols of each codeword for storage in respective multilevel memory cells.

A further embodiment of the invention provides a computer program product including a computer readable storage medium having program instructions embodied therewith. The program instructions executable by a computer to cause computer to perform a method. The method encodes data words into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$. The method supplies the N symbols of each codeword for storage in respective multilevel memory cells.

A further embodiment of the invention provides an encoder apparatus for encoding data for storage in multilevel memory cells having q cell-levels, the apparatus including a register for storing input data words, and encoder logic. The encoder logic encodes the data words into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$. The encoder logic outputs the N symbols of each codeword for storage in respective multilevel memory cells.

A further embodiment of the invention provides a data storage device including memory having multilevel memory cells and an encoder apparatus for encoding data words via said encoding scheme to produce respective N-symbol codewords. The data storage device may also include a read/write apparatus for writing the symbols of each codeword in respective memory cells and for reading memory cells to obtain respective read signal components each corresponding to a said symbol; and a decoder apparatus for decoding N-symbol codewords, each corresponding to N read signal components, in dependence on said encoding scheme to obtain respective data words.

BRIEF DESCRIPTION OF THE DRAWINGS

Where features are described herein with reference to an embodiment of one aspect of the invention, corresponding features may be provided in embodiments of another aspect of the invention as appropriate.

Embodiments of the invention will now be described, by way of example, with reference to the accompanying drawings in which:

FIGS. 5 to 7 indicate code parameters for respective alternative implementations of the second encoding scheme;

FIGS. 8 and 9 indicate code parameters for respective modifications to the second encoding scheme;

DETAILED DESCRIPTION

Figure 1:
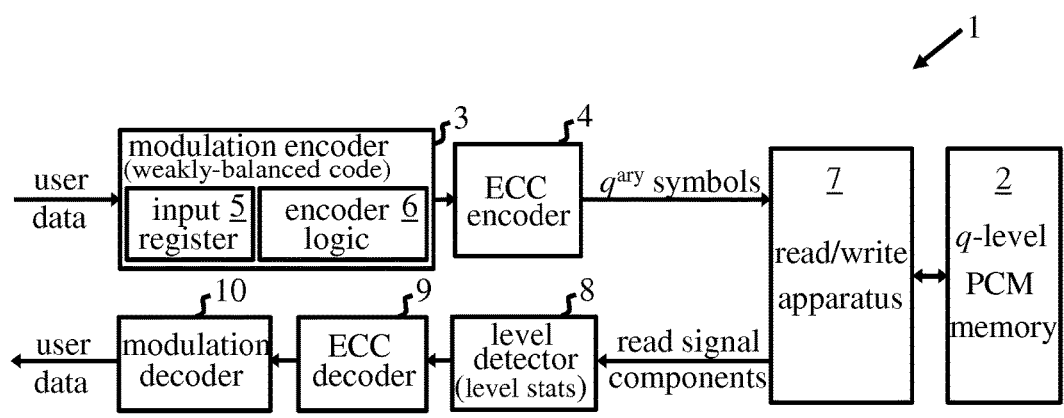
FIG. 1 is a schematic block diagram of a data storage device embodying the invention.

An embodiment of a first aspect of the present invention provides a method for encoding data for storage in multi-level memory cells having q cell-levels. The method includes encoding data words into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$; and supplying the N symbols of each codeword for storage in respective multi-level memory cells.

In methods embodying the invention, the encoding scheme does not require balancing of symbol values as in the prior methods discussed above. Codewords can have unequal multiplicities of the q>2 symbol values, but the encoding scheme ensures that all q symbol values occur no less than $\mu$ times in every codeword, where $\mu$ is a predetermined number $\geq 2$. By imposing this more relaxed constraint on the multiplicities of symbol values, the encoding scheme implements a type of code which is referred to herein as a "weakly-balanced" code. These weakly-balanced codes offer a sufficient degree of data symmetry on readback to provide good error performance in MLC memory even with small readback block sizes. However, this can be achieved without imposing a balance constraint, requiring equal symbol multiplicities, in the encoding process, and hence without the penalty in code rate associated with such a constraint. High code rates can therefore be achieved with weakly-balanced codes. Moreover, methods embodying the invention may provide easily-implementable, low-complexity encoding schemes, permitting efficient encoder/decoder implementations in MLC devices.

The minimum multiplicity $\mu$ for symbol values preferably satisfies $\mu \geq 3$, and embodiments of the invention can achieve $\mu \geq 4$ or higher depending on the code length and particular encoding scheme employed. In preferred embodiments to be described, the encoding scheme implements a rate K/N code and parameters of the encoding scheme are determined such that $\mu$ is a maximum possible value for the encoding scheme.

In some embodiments, the encoding scheme is based on a "symbol flipping" approach involving flipping of symbols such that the value of a symbol is flipped to a paired value in accordance with a predefined mapping of the q symbol-values. This flipping, or exchanging, of symbol values can be implemented by bit-flipping for binary representations of the q symbol-values. In such embodiments, the encoding scheme can be adapted to encode data words having (N–p) symbols with one of the q symbol-values into respective N-symbol codewords. The encoding scheme may include:

(a) for a portion of a symbol sequence in a data word, flipping the value of each symbol in said portion in accordance with a predefined mapping of symbol-values;

(b) performing step (a) recursively for symbol sequences as required to achieve a multiplicity no less than $\mu$ for each symbol value in each codeword; and (c) adding p indicator symbols to indicate symbols flipped during steps (a) and (b). The individual indicator symbols can be added at any convenient stage of the process.

Preferred implementations detailed below achieve a redundancy of p=2 for q=4 with even code-length N.

In other embodiments the encoding scheme comprises mapping data words to respective codewords of a union of permutation codes, the permutation codes being defined by respective initial vectors in which the multiplicity of each of the q symbol-values is no less than $\mu$. These codes are translation stable codes as discussed further below, and inhibit problems associated with drift effects on decoding. Moreover such encoding schemes can be efficiently implemented by the well-known process of enumerative encoding. The multiplicities of the q symbol-values in the initial vectors can be determined such that $\mu$ is a maximum possible value for the encoding scheme here. For q=4, the encoding scheme can implement a rate (N–1)/N code.

In other encoding schemes based on such a union of permutation codes, assuming that the q symbol values are equally-spaced, i.e. after normalization correspond to respective nominal values 0, 1, 2, . . . (q–1), the initial vectors can be determined such that, for each of a majority of the initial vectors, the inner product of the nominal values corresponding to the initial vector with a vector having N symbols, each of value unity, is a predetermined constant V. With this additional constraint, as discussed further below, the codes can be considered to be almost translation invariant, offering superior robustness to drift effects. In preferred embodiments, the deviation of the inner product from the constant V for any of the initial vectors is $\leq V/12$. For q=4, such an encoding scheme can implement a rate (N–2)/N code.

For improved error performance, methods embodying the invention can include error-correction encoding the N-symbol codewords to generate parity data which is also supplied for storage in the multilevel memory cells. In preferred embodiments below, an error-correction-coded word including said parity data is generated by error-correction coding of a plurality P of the N-symbol codewords (optionally with some additional uncoded data). Each of the P N-symbol codewords is then supplied, with a portion of the parity data, for storage in the multilevel memory cells of a respective memory device. The error-correction-coded word is thus written across P memory devices which can be accessed in parallel for read/write operations.

An embodiment of a second aspect of the invention provides encoder apparatus for encoding data for storage in multilevel memory cells having q cell-levels. The apparatus comprises a register for storing input data words, and encoder logic adapted to:

encode the data words into respective codewords, each having N symbols with one of q symbol-values, via an encoding scheme adapted such that the q symbol-values have unequal multiplicities within at least some codewords, and the multiplicity of each of the q symbol-values in every codeword is no less than $\mu$, where $\mu \geq 2$; and output the N symbols of each codeword for storage in respective multilevel memory cells.

An embodiment of a third aspect of the invention provides a data storage device including:

memory having multilevel memory cells;

encoder apparatus according to the second aspect of the invention for encoding data words via said encoding scheme to produce respective N-symbol codewords;

read/write apparatus for writing the symbols of each codeword in respective memory cells and for reading memory cells to obtain respective read signal components each corresponding to a said symbol; and decoder apparatus for decoding N-symbol codewords, each corresponding to N read signal components, in dependence on said encoding scheme to obtain respective data words.

Embodiments of the invention may also provide a computer program and computer program product comprising program code means for causing a computer to perform a method according to the first aspect of the invention. It will be understood that the term "computer" is used in the most general sense and includes any device, component or system having a data processing capability for implementing a computer program. Moreover, a computer program embodying the invention may constitute an independent program or program set or may be an element of a larger program or program set, and may be supplied, for example, embodied in a computer-readable medium such as a disk or an electronic transmission for loading in a computer. The program code means of the computer program may comprise any expression, in any language, code or notation, of a set of instructions intended to cause a computer to perform the method in question, either directly or after either or both of (a) conversion to another language, code or notation, and (b) reproduction in a different material form.

FIG. 1 is a simplified schematic of a data storage device, here a phase-change memory (PCM) device 1, embodying the invention. The device 1 includes phase-change memory 2 for storing data in one or more integrated arrays of multilevel PCM cells. Each of the PCM cells in memory 2 can be set to one of q>2 nominal levels, designated $l_1$ to $l_q$ herein, by adjusting the resistance of the cell in known manner. Though shown as a single block in the figure, in general memory 2 may comprise any desired configuration of PCM storage units ranging, for example, from a single chip or die to a plurality of storage banks each containing multiple packages of storage chips. Device 1 includes encoder apparatus, comprising a modulation encoder 3 and an ECC encoder 4, for encoding the user data to be stored in memory 2. The modulation encoder 3 comprises a register 5 for receiving input user data, and encoder logic for encoding data words into $q^{ary}$-symbol modulation codewords via an encoding scheme detailed below. The modulation codewords are further encoded by ECC encoder 4 to generate $q^{ary}$-symbol error-correction codewords. Read/write apparatus 4 controls writing of the resulting codewords in memory 2, and subsequent reading of memory cells to obtain read signals corresponding to the codewords. Decoding apparatus of the device 1 comprises a level detector 8, an ECC decoder 9, and a modulation decoder 10. The level detector 8 includes functionality for estimating the level statistics for the q cell-levels from the read signal components obtained from respective memory cells. These level statistics are used in decoding of error-correction codewords in ECC decoder 9. The modulation decoder 10 performs modulation decoding of the resulting modulation codewords to recover the original user data.

In general, functionality of the encoding and decoding apparatus 3, 4, 8, 9, 10 of device 1 may be implemented by control circuitry of a memory device, e.g. a memory chip, which forms part of memory 2, or by a separate device, such as a memory controller, which controls a set of memory devices in memory 2. In a typical arrangement, the functionality may be implemented via a combination of control logic in a memory controller and individual memory devices. In general, functionality of the encoding/decoding apparatus may be implemented in hardware, software or a combination thereof. Suitable implementations will be apparent to those skilled in the art from the description herein. In particular, the control logic 6 of modulation encoder 3, which implements the encoding schemes detailed below, may be embodied in hardware or software or a combination of hardware and software components. For example, the encoding process could be performed in whole or in part by software which configures a computer to implement the functionality described. The corresponding decoder logic of data decoder 10 may be implemented in similar manner, and suitable software will be apparent to those skilled in the art in each case. For reasons of operating speed, however, the use of hardwired logic circuits is generally preferred to implement encoder/decoder functionality. Again, suitable implementations will be readily apparent from the description of operation herein.

In operation of device 1, the input user data to be recorded in memory 2 is supplied to input register 5 of modulation encoder 3. The encoder logic 6 encodes input data words into respective length-N, $q^{ary}$-symbol codewords. Each codeword thus has N symbols each of which has one of q possible symbol-values. The encoding scheme implemented by encoder logic 6 generates codewords of a weakly-balanced code as described in more detail below. The resulting modulation codewords are output by modulation encoder 3 to ECC encoder 4. (In some embodiments illustrated below, small portions of user data, say tens of bytes, may be passed directly to the ECC encoder 4, without being modulation encoded). The modulation codewords (plus any additional uncoded data as appropriate) are error-correction encoded in ECC encoder 4 to generate parity data. Addition of the parity data results in an ECC word which is output by the ECC encoder 4 as a block of $q^{ary}$-symbols of length B. This length-B block of $q^{ary}$ symbols is supplied to read/write apparatus 7 for storage in memory 2. The order of modulation encoding and ECC encoding here is known as a reverse concatenation scheme. The objective of such a scheme is to ensure that the major part of the length-B block of $q^{ary}$ symbols consists of modulation encoded data, which can be exploited by the level detector 8.

In a write operation, read/write apparatus 7 stores each $q^{ary}$ symbol of an ECC word in a respective multilevel memory cell. The q possible symbol values correspond to respective predetermined levels $l_1$ to $l_q$ of the q-level memory cells. Each memory cell is thus set to a level dependent on the symbol value to be stored in accordance with a predefined mapping of symbol values to cell levels. (Note that, when setting a cell to a given level, the actual resistance value x assumed by the cell may lie within a small interval around the nominal resistance value for the level due to write noise). To read a cell in a subsequent read operation, a small probing signal is applied to the cell to obtain a readback signal indicative of cell resistance. In the read operation, a block of B memory cells is read to obtain a real-valued read signal y containing B read signal components $y_k$, k=1, 2, ..., B each corresponding to a respective $q^{ary}$ symbol.

The B read signal components $y_k$ output by apparatus 7 in a read operation are processed in level detector 8 to identify components corresponding to each of the q symbol values and hence cell levels. For the modulation encoded part of the sequence of B read signal components, the level detector 8 can take the imposed constraints of the modulation code into account. Codeword detection of the modulation codewords can be performed here using a variety of known techniques. The detection process may, for example, involve one or more stages of ML (maximum-likelihood), MAP (maximum-a-posteriori) or MD (minimum distance) decoding, as typically performed in expectation maximization (EM) algorithms. The resulting signal level distributions corresponding to each of the q cell levels are then processed in detector 8 to derive the level statistics, e.g. level means and variances, which are supplied to ECC decoder 9 with the B estimated symbol values for the readback block. ECC decoder 9 uses the B estimated symbol values together with the level statistics to decode the ECC words corresponding to the B symbol estimates for the block. The decoded codewords are then output to modulation decoder 10 which performs the inverse of the encoding operation in encoder 3 to recovering the corresponding user data.

The operation of modulation encoder 3 will now be described in more detail. The modulation encoding scheme is adapted to implement a weakly-balanced code. With such a code, as defined herein, the q possible symbol-values have unequal multiplicities within at least some codewords of the code. That is, not all q symbol multiplicities are equal in these codewords. However, the multiplicity of each of the q symbol-values in every codeword of the code is no less than a predetermined value μ, where μ≥2. A first type of encoding scheme embodying the invention uses symbol-flipping to enforce the μ-constraint. Such a scheme encodes data words having (N-p) $q^{ary}$ symbols into respective N-symbol modulation codewords. In general terms, the following steps are performed to encode an input data word. (1) For a selected portion of a particular symbol sequence in the data word, the value of each symbol in that portion is flipped to a paired value in accordance with a predefined mapping of the q symbol-values. (2) Step (1) is then performed recursively for further symbol sequences as required to achieve a multiplicity no less than μ for each symbol value in the codeword. (3) The resulting (N-p) symbols are then supplemented by adding p indicator symbols to indicate symbols flipped during steps (1) and (2).

An example of the first encoding scheme is described in the following for (q=4)-level cells. Let $x=x_1 x_2 \ldots x_K$ be a length-K sequence over the $4^{ary}$ alphabet A={0, 1, 2, 3}. The multiplicity of a symbol s within the sequence x is defined by $$m_s = \#\{i: x_i = s\}$$

The multiplicity of a "super-symbol" {a,b}, a, b∈A, a≠b, is defined similarly by $$M_{(a,b)} = \#\{i: x_i = a \text{ or } x_i = b\}$$

In the following example, two super-symbols $S_1$ and $S_2$ correspond to the symbol values {0,1} and {2,3} respectively. The multiplicity of super-symbols $S_1$ is defined as $M_1 = \#\{i: x_i = 0 \text{ or } x_i = 1\}$. The multiplicity of super-symbols $S_2$ is defined as $M_2 = \#\{i: x_i = 2 \text{ or } x_i = 3\}$. A first step of the encoding process effectively involves flipping of super-symbols in the input sequence x. In subsequent steps, symbol flipping is performed separately for the subsequences of super-symbols $S_1$ and $S_2$.

The encoder logic is defined by a balancing map F: $A^K \rightarrow A^{K+2}$, which encodes a length-K input sequence x into a length-K weakly-balanced output sequence z' plus 2 additional encoding symbols $p=[p_1 p_2]$. The resulting sequence z=z'p corresponds to a modulation codeword of length N=K+2.

Figure 2:
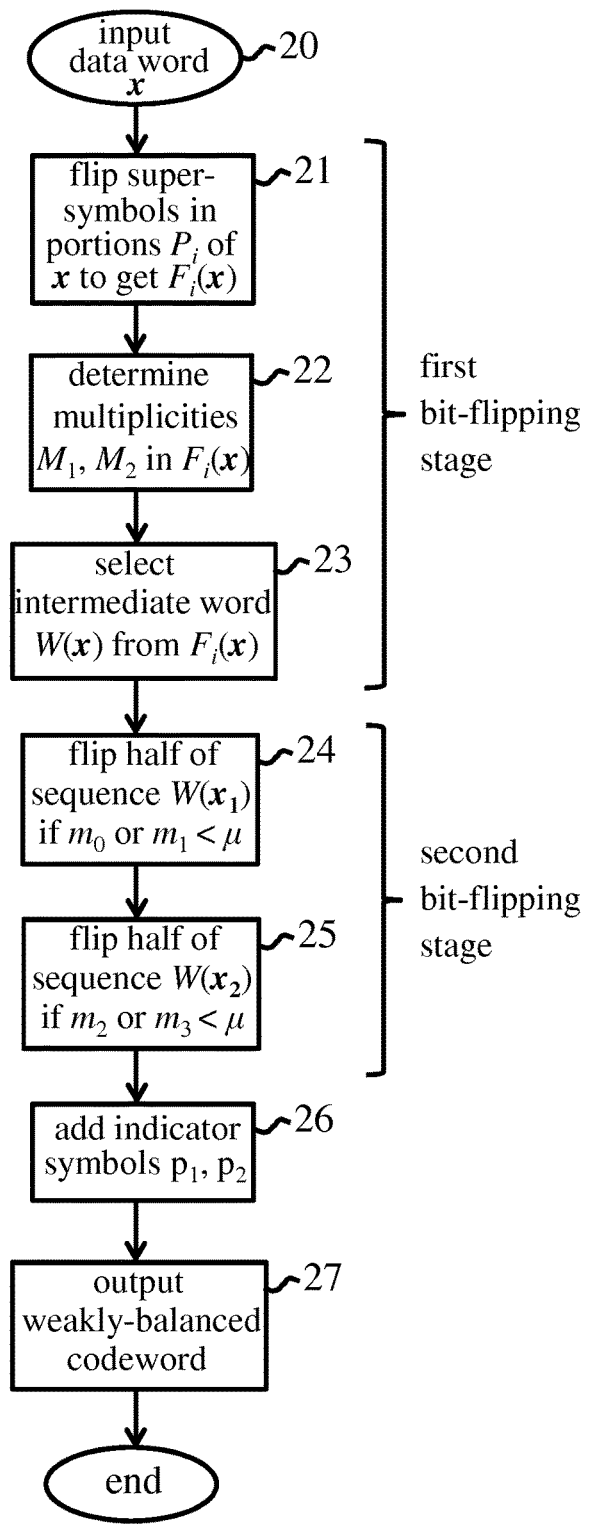
FIG. 2 indicates steps of a first encoding scheme implemented by encoder apparatus of the FIG. 1 device.

The main steps performed by encoder logic 6 in this embodiment are indicated in the flow chart of FIG. 2. Operation begins, as indicated at step 20, on receipt of an input data word x. The K=(N-2) $4^{ary}$ symbols of the data word x can be formed simply as K pairs of bits of binary input data stored in the encoder register 5. In step 21, the encoder logic 6 applies four symbol-flipping operations $F_i$, (i=1 to 4) to the K-symbol sequence x. Each symbol-flipping operation $F_i$ operates on a respective portion $P_i$ of the sequence x where:

portion $P_0$ consists of zero symbols;
portion $P_1$ consists of the first $\lfloor N/4 \rfloor$ symbols of x;
portion $P_2$ consists of the first $\lfloor 2N/4 \rfloor$ symbols of x; and
portion $P_3$ consists of the first $\lfloor 3N/4 \rfloor$ symbols of x;

Here, $\lfloor t \rfloor$ denotes largest integer ≤t. The symbol-flipping operations $F_i$ are thus defined by:

$F_0$: no component is flipped (portion $P_0$ contains zero symbols);
$F_1$: symbol values in $P_1$ are flipped using $0 \leftrightarrow 2$ and $1 \leftrightarrow 3$;
$F_2$: symbol values in $P_2$ are flipped using $0 \leftrightarrow 2$ and $1 \leftrightarrow 3$; and
$F_3$: symbol values in $P_3$ are flipped using $0 \leftrightarrow 2$ and $1 \leftrightarrow 3$.

Symbol values are thus flipped in accordance with the predefined mapping ($0 \leftrightarrow 2$ and $1 \leftrightarrow 3$) of symbol-values between the two symbol-value pairs {0, 1} and {2, 3} defined by super-symbols $S_1$ and $S_2$. With this mapping, symbol flipping can be accomplished by flipping a single bit in each $4^{ary}$ symbol.

Let $F_i(x)$ denote the result of the $i^{th}$ bit-flipping operation $F_i$. In step 22, the encoder logic determines, for each symbol-value pair {0, 1} and {2, 3}, the multiplicity M of symbols in each $F_i(x)$ with values in that pair. These multiplicities are the multiplicities $M_1$ and $M_2$ of the super-symbols $S_1$ and $S_2$. In step 23, an intermediate word W(x) is obtained by selecting the sequence $F_i(x)$ which satisfies $M \geq \lfloor N/4 \rfloor + \lceil N/8 \rceil$ for each sequence, i.e.:

$$\min\{M_1, M_2\} \geq \lfloor N/4 \rfloor + \lceil N/8 \rceil$$

where $\lceil t \rceil$ denotes the smallest integer ≥t. A single symbol $p_1 = i$ is enough to indicate the selected flipping operation $F_i(x)$ and hence the portion $P_i$ whose symbols were flipped. This completes a first stage of the bit-flipping scheme.

The second stage of the scheme is implemented in two steps indicated at 24 and 25 in FIG. 2. Step 24 operates on the sequence $W(x_1)$ of super-symbols $S_1$ in the intermediate word W(x), i.e. the sequence of symbols with values in the pair {0, 1}. If this sequence $W(x_1)$ does not satisfy the required μ constraint (i.e. if $m_0 < \mu$ or $m_1 < \mu$) then, in step 24, bit-flipping is performed to flip the symbols in one half, e.g. the first half, of $W(x_1)$ to the other value of the {0, 1} pair. The sequence $W(x_1)$ is thus transformed into a weakly-balanced sequence as required. This step requires 1 bit for flagging if bit-flipping was performed for $W(x_1)$. In step 25, the encoder logic repeats step 24 for the sequence $W(x_2)$ of super-symbols $S_2$ in the intermediate word W(x), i.e. the sequence of symbols with values in the pair {2, 3}. The sequence $W(x_2)$ is thus transformed into a weakly-balanced sequence as required. Again, this step requires 1 bit for flagging if bit-flipping was performed for $W(x_2)$. The second stage of the bit-flipping scheme thus requires a total of two bits, i.e., one $4^{ary}$ symbol $p_2$, to indicate bits flipped in steps 24 and 25. Adding the two indicator symbols $p_1$, $p_2$ to the resulting sequence, represented by step 26 of FIG. 2, completes the weakly-balanced codeword. This is output for storage in step 27, and the encoding operation is complete for the input data word.

By selecting the bit-flipping locations as described above, a minimum multiplicity of $\mu=2$ can be achieved for this encoding scheme with an overhead of p=2 and a code-length of N≥22. Different multiplicities $\mu$ can be enforced for different values of N. For N≥28 with p=2, a multiplicity of $\mu=3$ can be achieved, and $\mu=4$ can be enforced for N≥38 with p=2. To perform the inverse modulation encoding, decoder 10 simply reads the indicator symbols [$p_1$, $p_2$] and applies the known bit-flipping operations in reverse order. This encoding scheme thus implements high-rate, weakly-balanced codes with particularly simple encoding/decoding operation. Moreover the code construction can be easily modified to support different input word lengths K.

A second type of encoding scheme embodying the invention is based on permutation codes. A permutation code is characterized by a vector of length N (the "initial vector") on which the permutation group of N letters operates. The code is completely determined by its length N and the initial vector $X_0$ which has N components (symbols). The codewords consist of a set of length N vectors that are obtained through a permutation of the components of the initial vector. The second encoding scheme maps data words to respective $q^{ary}$-symbol codewords of a union of permutation codes. These permutation codes are defined by respective initial vectors in which the multiplicity of each of the q symbol-values is no less than $\mu$. In embodiments to be described, q=4 and the encoding scheme implements a weakly-balanced code of rate (N−1)/N. An exemplary embodiment will be described first for a code length of N=24.

Let $z=z_1z_2 \ldots z_{24}$ be a sequence of length 24 over the $4^{ary}$ alphabet A={0, 1, 2, 3}. There are $4^{24}$ $4^{ary}$ sequences of length N=24. The number of length–(N=24) sequences that do not satisfy a multiplicity constraint of $\mu=3$ is upper bounded by $$M_{fail3}=4(3^N+N3^{N-1}+\tfrac{1}{2}N(N-1)3^{N-2}).$$

Since $4^{23}<4^{24}-M_{fail3}$, there are enough length-24 sequences to map every length-23 sequence $x=x_1x_2 \ldots x_{23}$ into a unique length-24 sequence $z=z_1z_2 \ldots z_{24}$ which satisfies the $\mu=3$ constraint.

We will characterize a set of $4^{23}$ length-24 sequences which all satisfy the multiplicity-3 constraint. Indeed, by appropriate selection of the initial vectors as described below, the resulting set of $4^{23}$ length-24 sequences satisfies the even-stronger $\mu=4$ constraint.

Consider first the initial vector $X_0$=[0 0 0 0 0 0 0 1 1 1 1 1 2 2 2 2 2 2 3 3 3 3 3 3]. This has multiplicities $m_0=7$, $m_1=6$, $m_2=6$, $m_3=5$ of the symbol values 0, 1, 2, and 3, respectively. The corresponding permutation modulation code consisting of all permutations of $X_0$ has 24!/(7! 6! 6! 5!) codewords.

By choosing the multiplicities $m_0=6$, $m_1=7$, $m_2=6$, $m_3=5$, one obtains another permutation modulation code with the same number of codewords. Similarly, by selecting $m_0=6$, $m_1=6$, $m_2=7$, $m_3=5$ or $m_0=6$, $m_1=6$, $m_2=5$, $m_3=7$, one gets two more permutation modulation codes of the same type.

There are 12 possible combinations for the multiplicities, each of which results in 24!/(7! 6! 6! 5!) codewords. Thus, the multiplicity pattern [7, 6, 6, 5] gives rise to 12 codes of the same type and size 24!/(7! 6! 6! 5!).

Figures 3, 4:
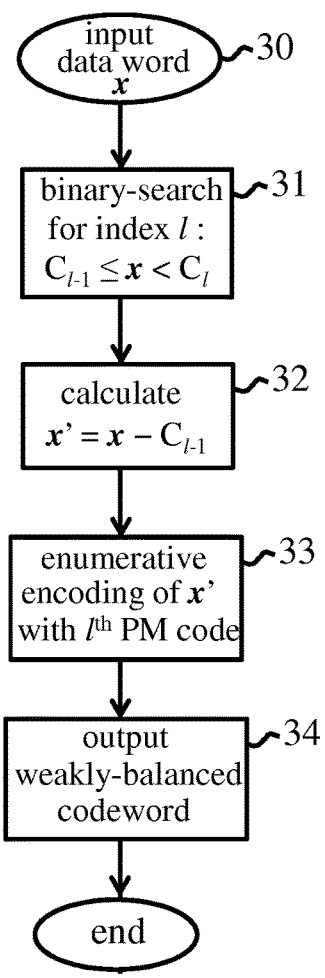
FIG. 3 indicates code parameters for a second encoding scheme implemented by the encoder apparatus.
FIG. 4 indicates steps of the second encoding scheme.

The table of FIG. 3 indicates the multiplicity patterns of the symbol multiplicities $m_i$, i=0, 1, 2, 3 for a union of length-(N=24) permutation codes providing the weakly-balanced code of this embodiment. This table specifies 60 initial vectors of 60 permutation modulation codes. By choosing e.g. the first 50 initial vectors and using the union of the corresponding 50 permutation modulation codes, one obtains a weakly-balanced code with more than $4^{23}$ codewords, providing a code rate of 23/24 which satisfies a $\mu=4$ constraint. Moreover, this code is also "translation-stable". With a translation stable code as defined in our U.S. Pat. No. 8,578,246 B2, each codeword has a unique sequence of relative symbol values. On recording in MLC memory, data is effectively encoded in the relative positions of cell levels. This offers good resistance to certain effects of drift noise on codeword detection.

The above code can be efficiently implemented in encoder 3 via enumerative encoding. This well-known technique is described, for example, in: "Enumerative Source Encoding", T. Cover, IEEE IT-1973; "Permutation codes for sources", Berger et al., IEEE IT-18, January 1972; and "Fast and efficient construction of an unbiased random sequence," Ryabko &. Matchikina, IEEE Trans. Inform. Theory, vol. 46, pp. 1090-1093, 2000. Briefly, the sequence space of all 4-ary sequences of length 23 is partitioned into 50 parts of increasing order (with respect to lexicographic ordering). The cardinalities of the first 49 parts correspond to the cardinalities of the first 49 permutation modulation codes identified in FIG. 3; the last part is smaller than the 50th permutation modulation code because not all codewords of this last code are needed to achieve an overall cardinality of $4^{23}=2^{46}$.

This partitioning is determined by 49 46-bit numbers $C_1$, $C_2$, ..., $C_{49}$, which are in increasing order. Define $C_0$ as the zero bit string and $C_{50}$ as $2^{46}$ in binary representation. The encoding operation performed by encoder logic 6 in this case is indicated in the flow chart of FIG. 4. Operation begins in step 30 on receipt of a 46-bit input word x. In step 31, the encoder logic performs a binary search over the set of numbers $C_1$, $C_2$, ..., $C_{49}$ to identify the index l for which $C_{l-1} \leq x < C_l$. Next, in step 32, the encoder logic subtracts $C_{l-1}$ from binary input x to obtain the modified binary input $x'=x-C_{l-1}$. In step 33, the encoder logic performs enumerative encoding of the modified binary input x' using the $1^{th}$ permutation modulation (PM) code. The resulting weakly-balanced codeword is then output in step 34, and encoding is complete for the data word.

Step 33 is performed using an efficient enumerative encoder in encoder logic 6. Enumeration techniques are sequential, i.e., encoding/decoding operations are carried out by performing a few simple operations for each component of the input vector. With a code length of 24 and rate 23/24, the most complex operation is addition/comparison of two 46-bit numbers. To perform the inverse modulation encoding, decoder 10 simply determines the multiplicity of each symbol value in the modulation codeword, and thereby determines which permutation modulation code l has been used. Inverse enumerative encoding of the $l^{th}$ permutation modulation code is then performed, and the offset $C_{l-1}$ is added to the result to get the decoded data word x. Thus, the encoding scheme again implements high-rate weakly-balanced codes with simple and efficient encoding/decoding operation. Moreover, the multiplicities of the q symbol-values in the initial vectors for this scheme are determined such that $\mu=4$. This is not only the maximum possible value for the encoding scheme described, but also the maximum value for any equivalent scheme. That is, no other code of length 24 and rate 23/24 can achieve a higher value of $\mu$.

FIG. 5 indicates the multiplicity patterns for permutation codes used in another example of the second encoding scheme. This table specifies 84 initial vectors of 84 permutation modulation codes. The initial vectors have length N=32 and satisfy $a\mu=6$ constraint. By choosing e.g. the first 75 initial vectors and using the union of the corresponding 75 permutation modulation codes, one obtains a translation-stable code with more than $4^{31}$ codewords, providing a code rate of 31/32 with $\mu=6$. Encoding/decoding is done efficiently via enumerative encoding in a similar manner to the first example above. Compared to the first code, this second code has larger encoding complexity but a higher rate of 31/32 and a tighter $\mu=6$ constraint.

FIG. 6 indicates the multiplicity patterns used in a third example of the second encoding scheme. This table specifies 35 initial vectors of 35 permutation modulation codes. The initial vectors have length N=20 and satisfy $a\mu=4$ constraint. By using the union of these 35 permutation modulation codes, one obtains a translation-stable code with more than $4^{19}$ codewords, providing a code rate of 19/20 with $\mu=4$. Encoding/decoding is done via enumerative encoding as before. Compared to the first code above, this third code has smaller encoding complexity and satisfies the same $\mu=4$ constraint.

FIG. 7 indicates the multiplicity patterns used in a fourth example of the second encoding scheme. This table specifies 30 initial vectors of 30 permutation modulation codes. The initial vectors have length N=16 and satisfy $a\mu=3$ constraint. By using the union of these 30 permutation modulation codes, one obtains a translation-stable code with more than $4^{15}$ codewords, providing a code rate of 15/16 with $\mu=3$. Compared to the first code above, this fourth code gives a weaker $\mu=3$ constraint but has significantly lower encoding complexity for enumerative encoding due to the short code length.

Particular robustness to drift effects can be achieved with the second encoding scheme by imposing the additional constraint that the codes consist of a union of permutation modulation codes with initial vectors whose inner product with the all-one vector [1 1 . . . 1] is almost constant. This class of codes can be considered as almost "translation-invariant", where a "translation-invariant code" is defined as follows. We consider a simple drift model where the q nominal cell levels are equally-spaced, i.e. of the form $l_i=a$ $i+b$, for i=0, 1, . . . , q-1 and some fixed parameters a and b. In this simple drift model, we assume that all nominal write levels are shifted by the same amount d, i.e., the nominal write levels are corrupted by some (independent and identically distributed) additive Gaussian noise with mean d and some variance $s^2$. At readback, the decoder selects the codeword that minimizes the Euclidean distance to the received word. For a translation-invariant code which consists of a union of permutation modulation codes with initial vectors in which the q symbol values are equally-spaced, i.e. after normalization correspond to the respective nominal values 0, 1, 2, . . . (q-1), the inner product of every initial vector with the all-one vector [1 1 . . . 1] is constant. Such a translation-invariant code is also translation-stable, and translation-invariance is thus a stronger condition than translation-stability. With a translation-invariant code, the decoder is invariant to drift, i.e. each codeword has a drift-invariant decision region and, thus, the decoding decision does not depend on the drift parameter d. However, if the code is almost translation-invariant, the decoder depends only very weakly on the drift parameter d, which can essentially be neglected.

A weakly-balanced, almost translation-invariant code can be based on a union of permutation codes wherein, if the q symbol values are equally-spaced, corresponding to respective normalized nominal values 0, 1, 2, . . . (q-1), the initial vectors are determined such that, for each of a majority of the initial vectors, the inner product of the nominal values corresponding to the initial vector with the length-N all-one vector [1 1 . . . 1] is a predetermined constant V. In the examples herein, the q symbol values are assumed to be 0, 1, 2 . . . (q-1), i.e. the same as the aforementioned nominal values. The condition is then effectively that inner product of most of the initial vectors with the length-N all-one vector [1 1 . . . 1] is a predetermined constant V. For example, the deviation of the inner product from the constant V for any of the initial vectors may be $\leq V/12$. An example of such a code of rate (N−2)/N is characterized in FIG. 9 for q=4 and N=16.

The FIG. 8 table specifies 7 initial vectors of 7 permutation modulation codes. By using the union of these 7 permutation modulation codes, one obtains an almost translation-invariant code with more than $4^{14}$ codewords and $\mu=3$. In particular, for the symbol values q=0, 1, 2, 3, the inner product of the first 5 initial vectors with the all-one vector is a predetermined constant V=24. For the last two initial vectors the inner product is 25 and 23 respectively. Thus, the code is almost translation-invariant. Efficient enumerative encoding/decoding can be performed as before. Compared to the earlier permutation-based codes, this code has a much smaller rate of 14/16. However, the decoder is more robust to drift as the codewords belong to an almost translation-invariant code.

FIG. 9 indicates the multiplicity patterns used in another example of the foregoing encoding scheme for an (N−2)/N code. This table specifies 8 initial vectors of 8 permutation modulation codes. The initial vectors have length N=20 and satisfy a $\mu=4$ constraint. By using the union of these 8 permutation modulation codes, one obtains another almost translation-invariant code with more than $4^{18}$ codewords, providing a code rate of 18/20 with $\mu=4$. For the symbol values q=0, 1, 2, 3, the inner product of the first 5 initial vectors with the all-one vector is a predetermined constant V=30. For the last three initial vectors, the inner product is 31, 29 and 31 respectively. Encoding/decoding is done via enumerative encoding as before. Compared to the code above, this code has larger encoding complexity and but satisfies the stronger $\mu=4$ constraint and has a higher code rate. In addition, this code lies almost on an affine hyperplane orthogonal to the all-one vector [1 1 . . . 1] of length 20. This offers additional robustness to drift effects in detector 9.

Figure 10:
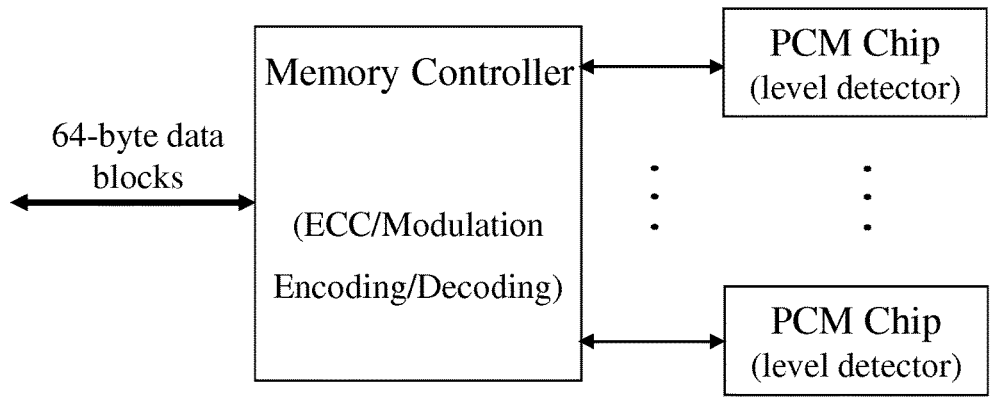
FIG. 10 is a schematic representation of the encoding architecture in a preferred implementation of the FIG. 1 device.

FIG. 10 is a schematic representation of the encoding architecture in a preferred implementation of the FIG. 1 device. ECC and modulation encoding/decoding is performed by a memory controller which controls writing to a plurality P of PCM chips. Each PCM chip includes a respective level detector for estimation of the level statistics on readback. The ECC encoder implements a single strong RS code to protect against both random errors and level-detector-failures or chip kills (long erasure bursts). The RS-encoder encodes 64-byte user data blocks at the controller level and the codewords are distributed across all chips. Such long RS codes are more powerful than multiple short codes on single chips. RS codes are also more efficient for erasure decoding than BCH (Bose Chaudhuri Hocquenghem) codes. Typically, the block size in terms of number of bits written per chip is 64 or 128. At the controller level in this example, 64-byte user data blocks are modulation encoded to obtain a plurality P of N-symbol modulation codewords. The RS-encoder encodes the P codewords (plus any remaining uncoded data as necessary) into an ECC word including parity data, and the ECC word is then distributed across all P chips. In particular, each of the P N-symbol codewords is supplied in parallel, with a portion of the parity data, for storage in a respective memory chip.

Figure 11:
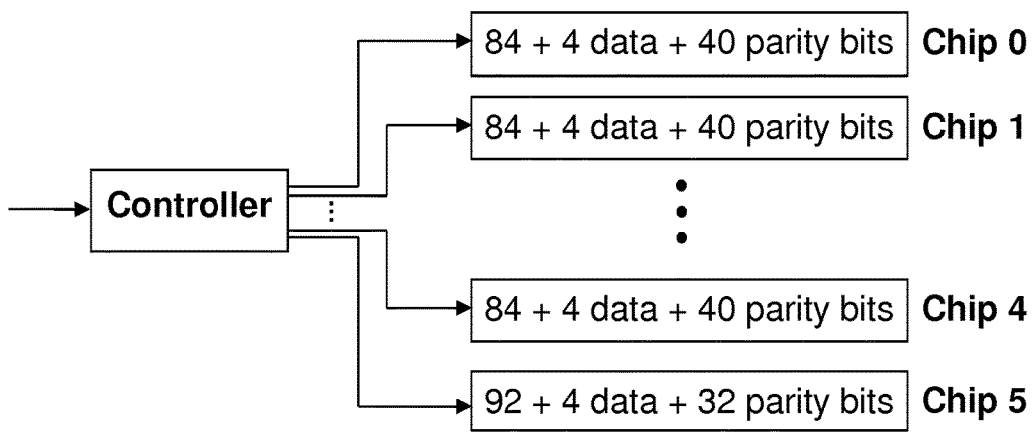
FIGS. 11 and 12 indicate exemplary implementations of the FIG. 10 architecture for the first and second encoding schemes.

FIG. 11 indicates an exemplary implementation of the FIG. 10 architecture for the first encoding scheme above. 64 Byte (512 bit) user data is encoded into ECC codewords of length 6×16=96 bytes. The input data is partitioned into 5 length-84 subsequences and one length-92 subsequence. Modulation encoding of the 84-bit subsequences (=42 $4^{ary}$-symbols) is performed by applying the above bit-flipping scheme with K=42. Modulation encoding of the 92-bit subsequences (=46 $4^{ary}$-symbols) is performed by applying the bit-flipping scheme with K=46. This enforces a μ=4 constraint with a total overhead of 6p=12 $4^{ary}$-symbols=24 bits (3 bytes). The ECC encoder applies an (N=96, K=64+3, t=14) RS code over GF(256) with minimum distance d=30. A possible partitioning of data and parity between the 6 PCM chips is shown in FIG. 11. The first two numbers shown for each chip correspond to the data and indicator bits of one modulation codeword, with the third number being for parity bits. Thus each chip stores 128 bits, i.e. 64 $4^{ary}$ symbols, in 64 $4^{ary}$ memory cells.

The overall code rate for the FIG. 11 scheme is 64/96=0.6666. Without any level detector/chip failures, this ECC scheme can correct up to t=14 errors. If a level detector fails or a single chip kill happens, there are up to L=16 erased bytes and the decoder can correct up to t=6 errors since L+2t<d=30.

Figure 12:
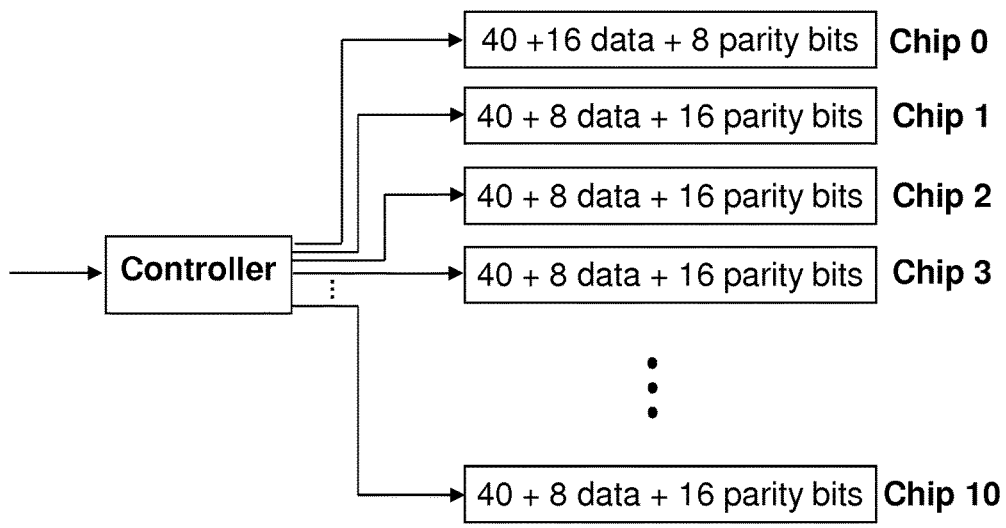

FIG. 12 indicates an exemplary implementation of the FIG. 10 architecture for the second encoding scheme with the code of FIG. 6. 64 Byte (512 bit) user data is encoded into ECC codewords of length 8×11=88 bytes. The 512 bit input data is partitioned into 418 and 94 bits, and the 418=11×38 bits are further partitioned into 11 blocks of 38 bits. Each of the eleven 38-bit blocks (=19 $4^{ary}$-symbols) is encoded via the enumerative rate-19/20 code of FIG. 6. In each case this results in a modulation encoded block of 40 bits (=5 bytes) satisfying the μ=4 constraint. The 94 unencoded user data bits are mapped into 12 bytes by padding 2 bits. The modulation encoded data (11×5 bytes=55 bytes) plus the 12 unencoded bytes are ECC encoded by an (N=88, K=67, t=10) RS code over GF(256) with minimum distance d=22. An exemplary partitioning of the encoded data among 11 PCM chips is shown in FIG. 12. All PCM chips receive a 5-byte modulation codeword followed by one or two unencoded bytes and one or two parity bytes. Thus each chip stores 64 bits, i.e. 32 $4^{ary}$ symbols, in 32 $4^{ary}$ memory cells.

The overall code rate for the FIG. 12 scheme is 64/88=0.7273. Without any level detector/chip failures, this ECC scheme can correct up to t=10 errors. If a level detector fails or a single chip kill happens, there are up to 8 erased bytes and the decoder can correct up to t=6 errors since 8+2t<d=22.

Figure 13:
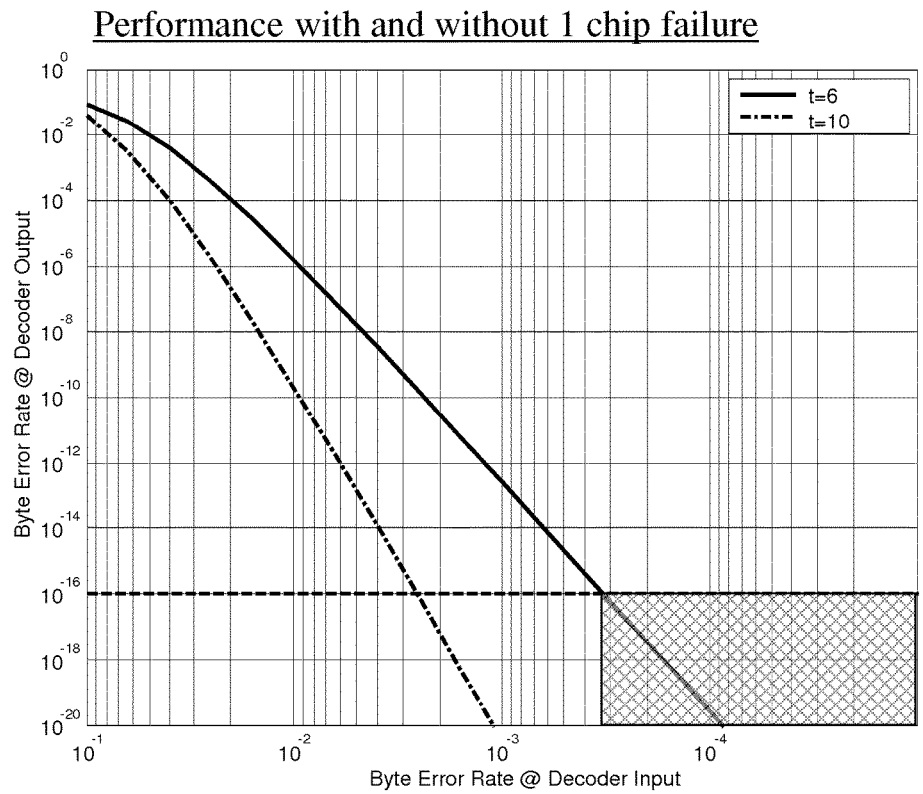
FIG. 13 indicates device error performance with the FIG. 10 architecture.

The modulation encoding schemes described above offer good error performance in storage device 1 even with the small block sizes used in the ECC schemes described above. This performance is achieved without imposing a balance constraint (requiring equal symbol multiplicities) in the encoding process, and hence without the code rate penalty associated with such a constraint. As illustration, FIG. 13 indicates device error performance with the FIG. 12 scheme in terms of output versus input byte error rate for the ECC decoder in the memory controller. The target byte error rate for the system is 1e-16 and is indicated by the horizontal dashed line in the figure. The curve indicated by the dash-dot line indicates the performance of the (88, 67, t=10)-RS code without any detector/chip failures. The solid line indicates performance with one detector/chip failure, which corresponds to 8 erasures and a reduced error correction capability of t=6. The cross hatched region at the right lower corner indicates the desired operating point of this ECC scheme. Thus, as long as the raw byte error rate at the detector output is below 3.3e-4, which corresponds to a raw bit error rate (RBER) of at most 4.1e-5, the ECC decoder can achieve the 1e-16 BER target even in the presence of one detector/chip failure. The (88, 67, t=10)-RS code with one detector/chip failure supports a RBER <4.1e-5 with an overall coding rate of 8/11=0.7273.

While exemplary embodiments have been described above, many alternatives and modifications can of course be envisaged. For instance, while operation has been described for $(q=4)^{ary}$ memory cells, using the basic principles described the encoding schemes can be easily adapted to accommodate other values of q and appropriate modifications will be apparent to those skilled in the art. Also, while memory 2 uses PCM cells, the techniques described are generic and can of course be applied to other multilevel memory cells.

It will be appreciated that many other changes and modifications can be made to the embodiments described without departing from the scope of the invention.

An embodiment of the invention provides a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method for encoding data for storage in multilevel memory cells having q cell-levels, the method comprising:
   encoding data words into respective codewords, wherein each codeword has N symbols, wherein each symbol has at least one q symbol-value, and wherein a q symbol-value relates to a cell-level;
   adapting an encoding scheme, wherein one or more codewords have unequal q symbol-value multiplicities, wherein a multiplicity is a number of times the q symbol-value appears in a codeword, wherein different multiplicities are enforced based on a length of N symbols, wherein the multiplicity of each q symbol-value in every codeword has a multiplicity constraint $\mu$, wherein $\mu$ is a predetermined number, wherein $\mu \geq 2$, wherein the encoding scheme ensures that each q symbol-value occurs no less than $\mu$ times in every codeword, and wherein enforcing the multiplicity constraint implements a weakly-balanced code output;
   sending the weakly-balanced code output from a modulation encoder; and
   supplying the N symbols of each codeword for storage in respective multilevel memory cells.

2. The method of claim 1 wherein the encoding scheme where $\mu \geq 3$ is adapted.

3. The method of claim 1, wherein the encoding scheme implements a rate K/N code, and wherein parameters of the encoding scheme are determined where $\mu$ is a maximum possible value for the encoding scheme.

4. The method of claim 1, wherein the encoding scheme is adapted to encode data words having (N–p) symbols with one of said q symbol-values into respective said codewords, the encoding scheme comprising:
   (a) for a portion of a symbol sequence in a data word, flipping the value of each symbol in said portion in accordance with a predefined mapping of symbol-values;
   (b) performing step (a) recursively for symbol sequences as required to achieve a multiplicity no less than $\mu$ for each symbol value in each codeword; and
   (c) adding p indicator symbols to indicate symbols flipped during steps (a) and (b).

5. The method of claim 4, wherein q=4, p=2, and N is even, and wherein the encoding scheme comprises:
   (a) producing an intermediate word from the (N−p)-symbol sequence of a data word by, for one of (i) a portion of length zero symbols, (ii) a portion of length $\lfloor N/4 \rfloor$ symbols, (iii) a portion of length $\lfloor 2N/4 \rfloor$ symbols, and (iv) a portion of length $\lfloor 3N/4 \rfloor$ symbols, flipping the value of each symbol in that portion in accordance with a predefined mapping of symbol-values between pairs of the q symbol-values, said one portion being selected such that, for each of said pairs of symbol-values, the multiplicity M of symbols in the intermediate word with values in that pair satisfies $M > \lfloor N/4 \rfloor + \lceil N/8 \rceil$;
   (b) for each sequence of symbols in the intermediate word with values in a said pair, flipping the value of each symbol in one half of that sequence to the other value of that pair if required to achieve a multiplicity no less than µ for each symbol value of the pair; and
   (c) adding p=2 indicator symbols to indicate symbols flipped during steps (a) and (b).

6. The method of claim 5, wherein the encoding scheme implements one of: a N >22 code with µ=2; a 28 ≤N <38 code with µ=3; and a N >38 code with µ>4.

7. The method of claim 1, wherein the encoding scheme comprises mapping data words to respective said codewords of a union of permutation codes, the permutation codes being defined by respective initial vectors in which the multiplicity of each of the q symbol-values is no less than µ.

8. The method of claim 7, wherein the multiplicities of the q symbol-values in the initial vectors are determined where µ is a maximum possible value for the encoding scheme.

9. The method of claim 7, wherein q=4 and the encoding scheme implements a rate (N−1)/N code.

10. The method of claim 9, wherein the encoding scheme implements one of: a N =20 code with µ=4; a N =24 code with µ=4; a N =code with µ=6; and a N =16 code with µ=3.

11. The method of claim 7, wherein for said q symbol values being equally-spaced and corresponding to respective normalized nominal values 0, 1, 2, . . . (q−1), the initial vectors are determined wherein each of a majority of the initial vectors, the inner product of the nominal values corresponding to the initial vector with a vector having N symbols, each of value unity, is a predetermined constant V.

12. The method of claim 11, wherein the deviation of said inner product from the constant V for any of the initial vectors is ≤V/12.

13. The method of claim 11, wherein q=4 and the encoding scheme implements a rate (N−2)/N code.

14. The method of claim 13, wherein N=16 and µ=3, and wherein the encoding scheme maps data words to respective said codewords of a union of seven permutation codes of which five permutation codes have respective initial vectors for which said constant V=24, one permutation code has an initial vector for which said inner product is 23, and one permutation code has an initial vector for which said inner product is 25.

15. The method of claim 13, wherein N=20 and µ=4, and wherein the encoding scheme maps data words to respective said codewords of a union of eight permutation codes of which five permutation codes have respective initial vectors for which said constant V=30, two permutation codes have respective initial vectors for which said inner product is 31, and one permutation code has an initial vector for which said inner product is 29.

16. The method of claim 7, wherein the encoding scheme comprises mapping data words to respective said codewords by enumerative encoding.

17. The method of claim 1, the method further comprising:
   performing error-correction encoding the N-symbol codewords to generate parity data; and
   supplying the parity data for storage in the multilevel memory cells.

18. The method of claim 17, including generating an error-correction-coded word including said parity data by error-correction coding a plurality P of the N-symbol codewords, and supplying each of the P N-symbol codewords, with a portion of said parity data, for storage in the multilevel memory cells of a respective memory device.

19. A computer program product for storage in multilevel memory cells having q cell-levels, comprising a computer readable non-transitory storage medium for storing program instructions which, when executed by a processor of a computer, cause the computer to perform a method, comprising:
   encoding data words, by the processor, into respective codewords, wherein each codeword has N symbols, wherein each symbol has at least one q symbol-value, and wherein a q symbol-value relates to a cell-level;
   adapting an encoding scheme, wherein one or more codewords have unequal a symbol-value multiplicities, wherein a multiplicity is a number of times the q symbol-value appears in a codeword, wherein different multiplicities are enforced based on a length of N symbols, wherein the multiplicity of each q symbol-value in every codeword has a multiplicity constraint µ, wherein µ is a predetermined number, wherein µ≥2, wherein the encoding scheme ensures that each q symbol-value occurs no less than µ times in every codeword, and wherein enforcing the multiplicity constraint implements a weakly-balanced code output;
   sending the weakly-balanced code output from a modulation encoder; and
   supplying the N symbols of each codeword for storage in respective multilevel memory cells.

20. An encoder apparatus for encoding data for storage in multilevel memory cells having q cell-levels, the encoder apparatus comprising a register for storing input data words, and encoder logic adapted to:
   encode data words into respective codewords, wherein each codeword has N symbols, wherein each symbol has at least one q symbol-value, and wherein a q symbol-value relates to a cell-level;
   adapt an encoding scheme, wherein one or more codewords have unequal q symbol-value multiplicities, wherein a multiplicity is a number of times the q symbol-value appears in a codeword, wherein different multiplicities are enforced based on a length of N symbols, wherein the multiplicity of each q symbol-value in every codeword has a multiplicity constraint µ, wherein µ is a predetermined number, wherein µ≥2, wherein the encoding scheme ensures that each q symbol-value occurs no less than µ times in every codeword, and wherein enforcing the multiplicity constraint implements a weakly-balanced code output;
   send the weakly-balanced code output from a modulation encoder; and
   output the N symbols of each codeword for storage in respective multilevel memory cells.

21. The encoder apparatus of claim 20, wherein said encoder logic comprises symbol-flipping logic adapted to encode data words having (N−p) symbols with one of said q symbol-values into respective said codewords by:
- (a) for a portion of a symbol sequence in a data word, flipping the value of each symbol in said portion in accordance with a predefined mapping of symbol-values;
- (b) performing step (a) recursively for symbol sequences as required to achieve a multiplicity no less than $\mu$ for each symbol value in each codeword; and
- (c) adding p indicator symbols to indicate symbols flipped during steps (a) and (b).

22. The encoder apparatus of claim 20, wherein said encoder logic comprises enumerative encoder logic for enumerative encoding of data words into respective said codewords of a union of permutation codes, the permutation codes being defined by respective initial vectors in which the multiplicity of each of the q symbol-values is no less than $\mu$.

23. A data storage device comprising:
memory having multilevel memory cells;
encoder apparatus for encoding data words into respective codewords and adapting an encoding scheme, wherein each codeword has N symbols, wherein each symbol has at least one q symbol-value, and wherein a q symbol-value relates to a cell-level, wherein one or more codewords have unequal q symbol-value multiplicities, wherein a multiplicity is a number of times the q symbol-value appears in a codeword, wherein different multiplicities are enforced based on a length of N symbols, wherein the multiplicity of each q symbol-value in every codeword has a multiplicity constraint $\mu$, wherein $\mu$ is a predetermined number, wherein $\mu \geq 2$, wherein the encoding scheme ensures that each q symbol-value occurs no less than $\mu$ times in every codeword, and wherein enforcing the multiplicity constraint implements a weakly-balanced code output;
read/write apparatus for writing the symbols of each codeword in respective memory cells and for reading memory cells to obtain respective read signal components each corresponding to a said symbol; and
decoder apparatus for decoding N-symbol codewords, each corresponding to N read signal components, in dependence on said encoding scheme to obtain respective data words.

24. The data storage device of claim 23, wherein the multilevel memory cells comprise phase-change memory cells.

* * * * *